US010079368B2

(12) United States Patent
Lee et al.

(10) Patent No.: US 10,079,368 B2
(45) Date of Patent: Sep. 18, 2018

(54) TRANSPARENT DISPLAY DEVICE

(71) Applicant: SAMSUNG DISPLAY CO., LTD., Yongin-si, Gyeonggi-do (KR)

(72) Inventors: Seung-Min Lee, Jeju-si (KR); Tae-Hyun Kim, Seoul (KR); Jung-Kyu Lee, Seoul (KR); Sang-Ho Park, Suwon-si (KR); Joo-Sun Yoon, Seoul (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/375,203

(22) Filed: Dec. 12, 2016

(65) Prior Publication Data

US 2017/0179441 A1 Jun. 22, 2017

(30) Foreign Application Priority Data

Dec. 21, 2015 (KR) .......................... 10-2015-0182545

(51) Int. Cl.
*H01L 51/52* (2006.01)
*H01L 27/32* (2006.01)

(52) U.S. Cl.
CPC ...... *H01L 51/5293* (2013.01); *H01L 27/3246* (2013.01); *H01L 27/3262* (2013.01); *H01L 51/5237* (2013.01)

(58) Field of Classification Search
CPC . H01L 51/52; H01L 51/5293; H01L 51/5237; H01L 27/3246; H01L 27/3262
See application file for complete search history.

(56) References Cited

U.S. PATENT DOCUMENTS

| 2013/0329288 A1* | 12/2013 | Yim | H01L 51/5281 |
| | | | 359/483.01 |
| 2014/0084266 A1* | 3/2014 | Yang | H01L 51/442 |
| | | | 257/40 |
| 2016/0043154 A1* | 2/2016 | Choi | H01L 27/3258 |
| | | | 257/40 |
| 2016/0211316 A1* | 7/2016 | Oh | H01L 27/3279 |

FOREIGN PATENT DOCUMENTS

| JP | 2013-084477 A | 5/2013 |
| KR | 10-2006-0134538 A | 12/2006 |
| KR | 10-2008-0036841 A | 4/2008 |
| KR | 10-2011-0080051 A | 7/2011 |
| KR | 10-2012-0044671 A | 5/2012 |
| KR | 10-2013-0121454 A | 11/2013 |
| KR | 10-2015-0072407 A | 6/2015 |

* cited by examiner

*Primary Examiner* — Phuc Dang
(74) *Attorney, Agent, or Firm* — Lee & Morse, P.C.

(57) ABSTRACT

A transparent display device according to example embodiments includes a substrate having a pixel area and a transmission area, a pixel circuit on the pixel area of the substrate, an insulation structure on the substrate to cover the pixel circuit, a first electrode on the pixel area of the substrate, the first electrode being at least partially penetrated the insulation structure and electrically connected to the pixel circuit, a display layer on the first electrode, a second electrode facing the first electrode and covering the display layer, and an anti-diffraction layer on the substrate, the anti-diffraction layer at least partially overlapping the transmission area and including a plurality of nano wires.

20 Claims, 20 Drawing Sheets

TRANSPARENT DISPLAY DEVICE

CROSS REFERENCE TO RELATED APPLICATION

Korean Patent Application No. 10-2015-0182545, filed on Dec. 21, 2015, in the Korean Intellectual Property Office, and entitled: "Transparent Display Device," is incorporated by reference herein in its entirety.

BACKGROUND

1. Field

Example embodiments relate to transparent display devices. More particularly, example embodiments relate to transparent display devices having a pixel area and a transmission area.

2. Description of the Related Art

Recently, a display device having transparent or transmitting properties has been developed. For implementing the transparent display device, the transparent display device includes a pixel area and a transmission area. Light output form the transparent display device is diffracted, resulting in constructive interference or destructive interference occurs. Thus, a diffraction image unwillingly appears. Accordingly, optical properties of the display decreases and definition of the image decreases.

SUMMARY

According to example embodiments, a transparent display device may include a substrate having a pixel area and a transmission area, a pixel circuit on the pixel area of the substrate, an insulation structure on the substrate to cover the pixel circuit, a first electrode on the pixel area of the substrate, the first electrode being at least partially penetrated the insulation structure and electrically connected to the pixel circuit, a display layer on the first electrode, a second electrode facing the first electrode and covering the display layer, and an anti-diffraction layer on the substrate, the anti-diffraction layer at least partially overlapping the transmission area and including a plurality of nano wires.

In example embodiments, the nano wires may be randomly arranged in a network structure.

In example embodiments, the nano wires may include a metal.

In example embodiments, a maximum spacing between each of the nano wires may be within a range of about 100 nm to about 500 nm.

In example embodiments, a first portion of the anti-diffraction layer may be disposed in the same layer as the first electrode.

In example embodiments, a second portion of the anti-diffraction layer may cover the first electrode.

In example embodiments, the transparent display device may further include a pixel defining layer on the insulation structure, the pixel defining layer exposing the first electrode. A first portion of the anti-diffraction layer may be disposed on the pixel defining layer.

In example embodiments, a second portion of the anti-diffraction layer may overlap the pixel area, and is disposed below the display layer.

In example embodiments, a second portion of the anti-diffraction layer may overlap the pixel area, and wherein the second portion of the anti-diffraction layer is disposed on the display layer.

In example embodiments, the second electrode may overlap the pixel area and the transmission area, a portion of the anti-diffraction layer is disposed on the second electrode.

In example embodiments, the transparent display device may further include a pixel defining layer defines a transmitting window exposing the insulation structure of the transmission area. The second electrode and the anti-diffraction layer may be sequentially stacked on the transmission area along a surface of the transmitting window.

In example embodiments, the pixel circuit may include an active pattern, a gate electrode, a source electrode, and a drain electrode. The insulation layer may include a gate insulation layer on the substrate to cover the active pattern, an insulating interlayer on the gate insulation layer to cover the gate electrode, and a via insulation layer on the insulating interlayer to cover the source electrode and the drain electrode. The source electrode and the drain electrode may penetrate the insulation interlayer and the gate insulation layer and contact the active pattern. The first electrode may be disposed on the via insulation layer, penetrates the via insulation layer, and contacts the drain electrode.

In example embodiments, the via insulation layer may be individually disposed on the pixel area. A transmitting window may be defined on the transmission area by sidewalls of the via insulation layer and a upper surface of the insulating interlayer. The second electrode and the anti-diffraction layer may be sequentially stacked on the transmission area along a surface of the transmitting window.

In example embodiments, the via insulation layer and the insulating interlayer may be disposed on the pixel area. A transmitting window may be defined on the transmission area by sidewalls of the via insulation layer and a upper surface of the gate insulation layer. The second electrode and the anti-diffraction layer may be sequentially stacked on the transmission area along a surface of the transmitting window.

In example embodiments, the transparent display device may further include a capping layer continuously disposed on the pixel area and the transmission area of the second electrode. A portion of the anti-diffraction layer may be disposed on the capping layer.

In example embodiments, the anti-diffraction layer may be disposed along a upper surface of the capping layer.

In example embodiments, the transparent display device may further include a packed layer and an encapsulation substrate that are sequentially stacked on the capping layer.

In example embodiments, the portion of the anti-diffraction layer may be interposed between the packed layer and the encapsulation substrate.

In example embodiments, the portion of the anti-diffraction layer may be disposed on the encapsulation substrate.

In example embodiments, the anti-diffraction layer may be disposed along an upper surface of the encapsulation substrate.

BRIEF DESCRIPTION OF THE DRAWINGS

Features will become apparent to those of skill in the art by describing in detail exemplary embodiments with reference to the attached drawings in which.

DETAILED DESCRIPTION

Exemplary embodiments will be described more fully hereinafter with reference to the accompanying drawings, in which various embodiments are shown.

Figure 1:
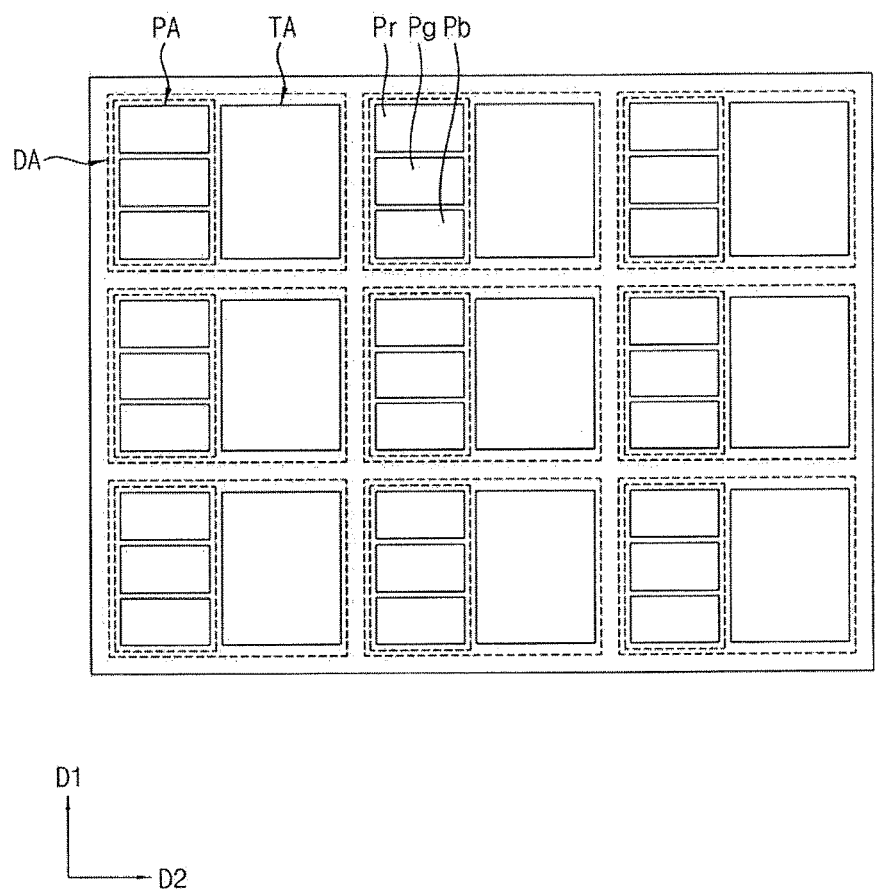
FIG. 1 illustrates a plan view of a transparent display device according to example embodiments.
Figure 2:
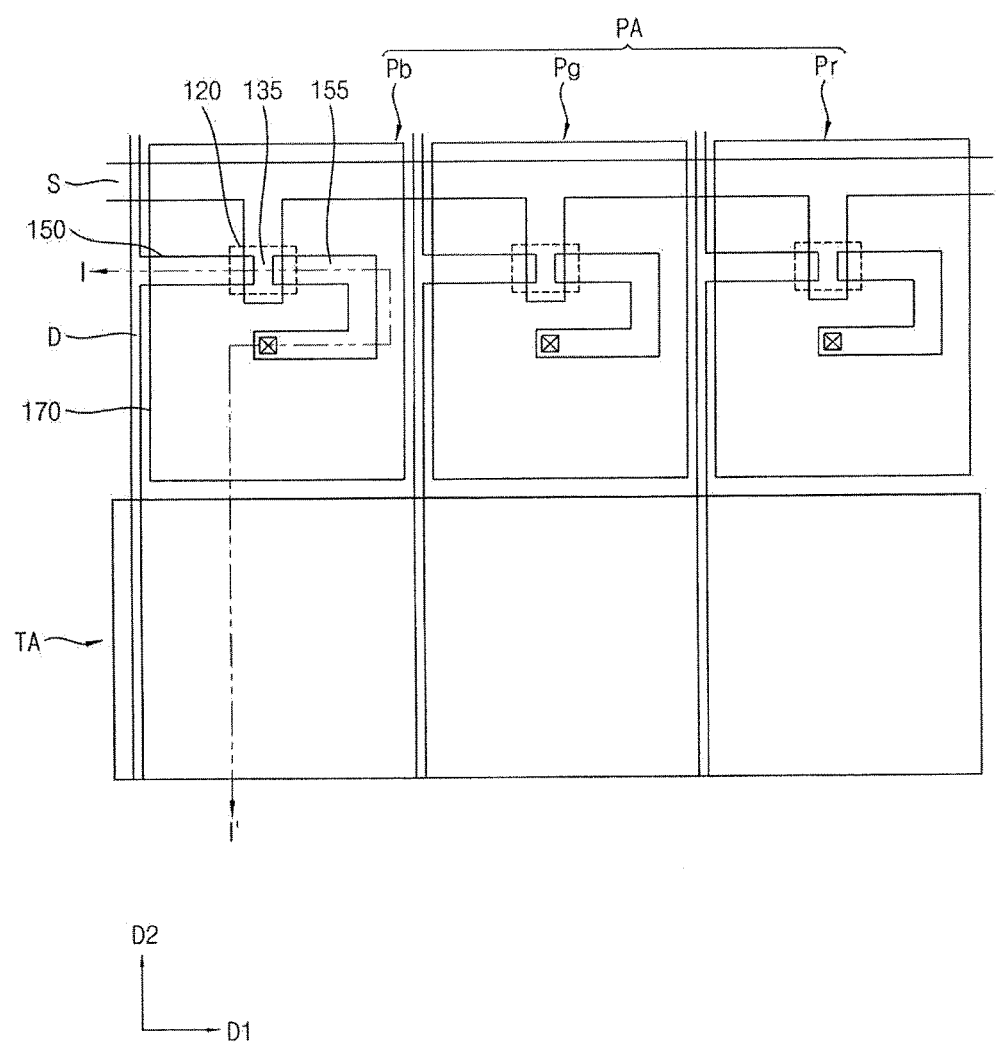
FIG. 2 illustrates an enlarged plan view of an example of a display area of the transparent display device of FIG. 1.
Figure 3:
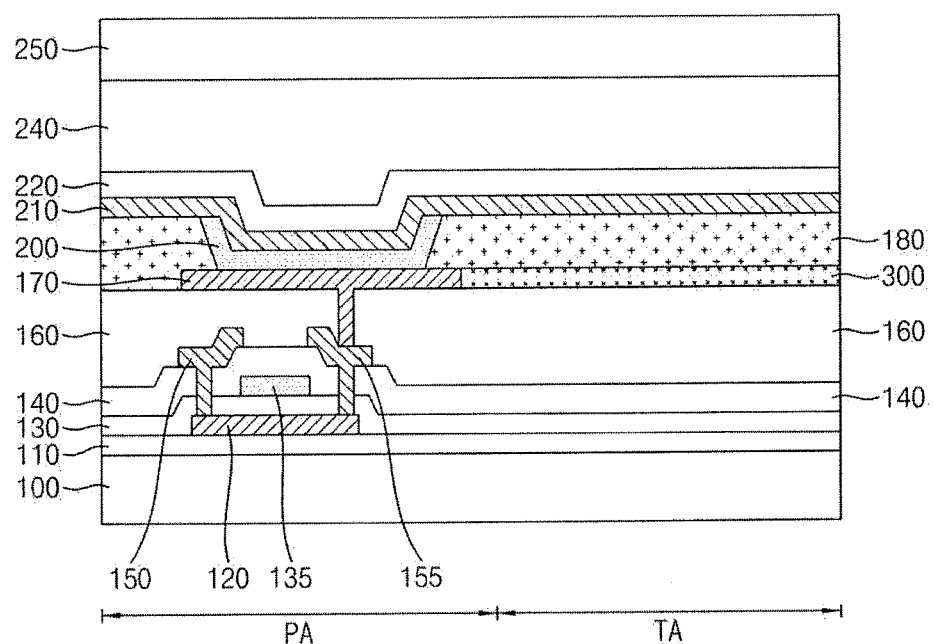
FIG. 3 illustrates a cross-sectional view taken along section lines I-I' of FIG. 2.

FIG. 1 is a plan view of a transparent display device according to example embodiments. FIG. 2 is an enlarged plan view illustrating an example of a display area of the transparent display device of FIG. 1. FIG. 3 is a cross-sectional view taken along section lines I-I' of FIG. 2.

Referring to FIGS. 1 through 3, the transparent display device may include a plurality of display areas DA. The display areas DA may be parallel to a substrate 100. The display areas DA may be arranged in a first direction D1 and a second direction D2 orthogonal to the first direction D1.

Each of the display areas DA may include a pixel area PA and a transmission area TA. A plurality of pixels in the pixel area PA, e.g., may be arranged adjacent in the first direction D1. For example, the pixel area PA may include a red pixel Pr, a green pixel Pg, and a blue pixel Pb.

Although FIGS. 1 and 2 illustrate the pixels Pr, Pg and Pb having substantially the same areas, at least one area of the pixels Pr, Pg and Pb may be different to increase luminance efficiency.

The transmission area TA in each of the display areas DA may extend adjacent to the red pixel Pr, the green pixel Pg, and the blue pixel Pb. In some embodiments, the transmission area TA may be individually patterned for each of the pixels of the pixel area PA. In some embodiments, the transmission area TA, e.g., may extend in the first direction D1 and provided in common to the display areas DA.

In one embodiment, a pixel circuit is arranged in the pixel area PA for implementing images. External light may be transmitted through the transmission area TA so that objects outside from the transparent display device may be seen.

A transistor, e.g., a thin film transistor (TFT), may be in each pixel of the pixel area PA. The transistor may be electrically connected to a data line D and/or a scan line S. As illustrated in FIG. 2, the data line D and the scan line may cross each other, and each pixel may be defined at each intersection region of the data line D and the scan line S. The pixel circuit may be defined by the data line D, the scan line S, and the transistors.

The pixel circuit may further include a power line parallel to the data line D. Each pixel may further include a capacitor electrically connected to the power line and the transistor.

Although FIG. 2 illustrates a single transistor in each of the pixels, each pixel may include at least two transistors, e.g., a switching transistor and a driving transistor may be in each of the pixels. The capacitor may be electrically connected between the switching transistor and the driving transistor.

The transistor may be on a portion of a barrier layer 110 on the pixel area PA of the substrate 100. The transistor may include an active pattern 120, a gate insulation layer 130, a gate electrode 135, a source electrode 150, and a drain electrode 155. A via insulation layer 160 may be cover the transistor. A first electrode 170 electrically connected to the drain electrode 155 may be on the via insulation layer 160.

The substrate 100 may be a transparent insulation substrate. For example, the substrate 100 may include a glass or polymer materials having transmissive and flexible properties. When the substrate 100 includes the polymer materials, the transparent display device may be provided as a transparent flexible display device. For example, the substrate 100 may include polymer materials, e.g., polyimide, polysiloxane, epoxy-based resin, acryl-based resin, polyester, etc. In one embodiment, the substrate 100 may include the polyimide.

The substrate 100 may include the pixel area PA and the transmission area PA.

The barrier layer 110 may be formed on the substrate 100. In some embodiments, the barrier layer 110 may be commonly and continuously provided on the pixel area PA and the transmission area TA. A diffusion of impurities or moistures between the substrate 100 and structures thereon may be blocked by the barrier layer 110.

For example, the barrier layer 110 may include a silicon oxide, a silicon nitride, or a silicon oxynitride. These may be used alone or in a combination thereof. In some embodiments, the barrier layer 110 may have a multi-stacked structure including a silicon oxide layer and a silicon nitride layer that may be alternately and repeatedly provided.

The active pattern 120 may be on a portion of the barrier layer 110 of the pixel area PA. The active pattern 120 may include a silicon-based compound such as polysilicon. In some embodiments, a source region and a drain region including p-type or n-type impurities may be provided at both ends of the active pattern 120. In some embodiments, the active pattern 120 may a semiconductor oxide, e.g., indium gallium zinc oxide ("IGZO"), zinc tin oxide ("ZTO"), or indium tin zinc oxide ("ITZO").

The gate insulation layer 130 may be on the barrier layer 110 to cover the active pattern 120. In some embodiments, the gate insulation layer 130 may include silicon oxide, silicon nitride, or silicon oxynitride. In some embodiments, the gate insulation layer 130 may have a multi-stacked structure including a silicon oxide layer and a silicon nitride layer, for example.

As illustrated in FIG. 3, the gate insulation layer 130 may extend commonly and continuously on the pixel area PA and the transmission area TA similar to the barrier layer 110. In some embodiments, the gate insulation layer 130 may be individually patterned to be on the pixel area PA.

The gate electrode 135 may be disposed on the gate insulation layer 130. The gate electrode 135 may be substantially superimposed over the active pattern 120. The gate insulation layer 120 may be between the active pattern 120 and the gate electrode 135.

The gate electrode 135 may be electrically connected to the scan line S. For example, as illustrated in FIG. 2, the gate electrode 135 may be branched from the scan line S.

The gate electrode 135 may include a metal, e.g., aluminum (Al), silver (Ag), tungsten (W), copper (Cu), nickel (Ni), chrome (Cr), molybdenum (Mo), titanium (Ti), platinum (Pt), tantalum (Ta), neodymium (Nd), or scandium (Sc), an alloy of the metals, or a nitride of the metal. The above-described elements may be used alone or in any combination thereof. The gate electrode 135 may have a multi-layered structure including at least two metal layers that physical and chemical properties are different each other. For example, the gate electrode 135 may have a multi-layered structure including Al and Mo, or Ti and Cu for reducing an electrical resistance.

An insulating interlayer 140 may be on the gate insulation layer 130 to cover the gate electrode 135. The insulating interlayer 140 may include silicon oxide, silicon nitride, and/or silicon oxynitride. The insulating interlayer 140 may have a multi-stacked structure including a silicon oxide layer and a silicon nitride layer.

As illustrated in FIG. 3, the insulating interlayer 140 may be commonly and continuously extended on the pixel area PA and the transmission area TA similar to the barrier layer 110. In some embodiments, the insulating interlayer 140 may be individually patterned to be on the pixel area PA.

The source electrode 150 and the drain electrode 155 may penetrate the insulating interlayer 140 and the gate insulation layer 130 to be in contact with the active pattern 120. The source electrode 150 and the drain electrode 155 may include a metal such as Al, Ag, W, Cu, Ni, Cr, Mo, Ti, Pt, Ta, Nd or Sc, an alloy of the metals or a nitride of the metal. The above-described elements may be used alone or in any combination thereof. For example, the source electrode 150 and the drain electrode 155 may have a multi-layered structure including different metals such as Al and Mo.

The source electrode 150 and the drain electrode 155 may be in contact with the source region and the drain region of the active pattern 120, respectively. A portion of the active pattern 120 between the source and drain regions may serve as a channel region substantially overlapping the gate electrode 135, e.g., in a third direction orthogonal to the first and second directions.

The source electrode 150, as illustrated in FIG. 2, may be electrically connected to the data line D. For example, the source electrode 150 may be branched from the data line D.

The transistor may be defined by the active pattern 120, the gate insulation layer 130, the gate electrode 135, the source electrode 150, and the drain electrode 155.

Although FIG. 3 illustrates a TFT having a top gate structure that the gate electrode 135 is on the active pattern 120, the TFT may have a bottom gate structure in which the gate electrode 135 under the active pattern 120.

The via insulation layer 160 may be formed on the insulating interlayer 140 to cover the source electrode 150 and the drain electrode 155. The via insulation layer 160 may accommodate a via-portion electrically connecting between the first electrode 170 and the drain electrode 155. The via insulation layer 160 may substantially serve as a planarization layer of the transparent substrate.

The via insulation layer 160 may include an organic material, e.g., polyimide, an epoxy-based resin, an acryl-based resin, or polyester. In some embodiments, the via insulation layer 160 may be commonly and continuously provided on the pixel area PA and the transmission area TA.

The first electrode 170 may be on the via insulation layer 160. The first electrode 170 may include a via-portion that extends through the via insulation layer 160 to be electrically connected to the drain electrode 155. In some embodiments, the first electrode may be individually disposed on each pixel. The first electrode 170 may serve as an anode of the transparent display device.

In one embodiment, the first electrode 170 may include a transparent conductive material having a high work function. For example, the first electrode 170 may include indium tin oxide (ITO), indium zinc oxide (IZO), zinc oxide or indium oxide, thereby improving transmittance of the transparent display device.

In one embodiment, the first electrode 170 may serve as a reflective electrode. For example, the first electrode 170 may include a metal such as Al, Ag, W, Cu, Ni, Cr, Mo, Ti, Pt, Ta, Nd or Sc, or an alloy of the metals. In one embodiment, the first electrode 170 may have a multi-layered structure including the transparent conductive material and the metal.

An anti-diffraction layer 300 may be on the same layer as the first electrode 170 and on the via insulation layer 160, e.g., may be adjacent, e.g., directly adjacent the first electrode 170 in the transmission area TA. At least a portion of the anti-diffraction layer 300 may overlap, e.g., be in, the transmission area TA.

When the transmission area TA is patterned for each pixel, the anti-diffraction layer 300 may be patterned at each transmission area. In contrast, when the transmission area TA is commonly and continuously provided on the different pixel areas PA, the anti-diffraction layer 300 may be commonly and continuously provided.

In some embodiments, the anti-diffraction layer 300 may include a plurality of nano wires randomly arranged in a network structure. The nano wires may include a metal or a nonmetal and may have thicknesses on the order of a nanometer. For example, the nano wires may include nickel (Ni), platinum (Pt), gold (Au), or silver (Ag). The nano wires may include carbon nano tubes. The nano wires may include silicon (Si), Indium-phosphide (InP), gallium nitride (GaN), silicon oxide ($SiO_2$), titanium oxide ($TiO_2$), and so on.

The anti-diffraction layer 300 may reduce or prevent light that pass boundaries between the transmission area TA and the pixel area PA from diffracting. Thus, the anti-diffraction layer 300 may reduce diffraction images that are displayed.

When the nano wires are arranged randomly, the nano wires may have various spacings, e.g., the nano wires may be arranged to be parallel to one another, but spacing between adjacent nano wires may be randomly varied. In some embodiments, a maximum spacing between adjacent nano wires may be within a range of about 100 nm to about 500 nm, e.g., less than most wavelengths of visible light, and may have a minimum spacing of greater than a thickness of the nano wires. When the maximum spacing is within the range, the light diffraction in the transparent display device may be reduced.

In some embodiments, the anti-diffraction layer 300 may include a polarizing plate, e.g., a wire grid polarizer, to allow only light having a single linear polarization to pass therethrough.

A back plane ("BP") structure may be defined by the pixel circuit, the insulation layers, the first electrode 170, and the anti-diffraction layer 300 that are formed on the substrate 100. The black plane structure may further include a pixel defining layer 180. The pixel defining layer 180 may be disposed on the anti-diffraction layer 300 to cover at least a portion of an upper surface of the first electrode 170. The pixel defining layer 180 may include a transparent organic material such as a polyimide-based resin or an acryl-based resin.

Each pixel included in the pixel PA may be exposed by the pixel defining layer 180. An area of another portion of the first electrode 170 that is not covered by the pixel defining layer 180 may substantially correspond to an emission area of each pixel. In some embodiments, the pixel defining layer 180 may extend to the transmission area TA.

A display layer 200 may be disposed on the pixel defining layer 180 and the first electrode 170. For example, the display area 200 may be disposed at sidewalls of the pixel defining layer 180 and the upper surface of the first electrode 170 that is exposed by the pixel defining layer 170.

The display layer 200 may include an organic light emitting layer that may be individually patterned for each of the red pixel Pr, the green pixel Pg and the blue pixel Pb to generate a different color of light in the each pixel. The organic emitting layer may include a host material excited by a hole or an electron, and a dopant material for improving an emitting efficiency through absorbing and releasing energy.

In some embodiments, the display layer 200 may further include a hole transport layer (HTL) interposed between the first electrode 170 and the organic emitting layer. The display layer 200 may further include an electron transport layer (ETL) on the organic emitting layer.

In some embodiments, the display layer 200 may further include a hole injection layer (HIL) under the display layer, and between the HTL and the first electrode 170. The display layer 200 may further include an electron injection layer (EIL) on the display layer 200 and interposed between the ETL and a second electrode 210.

The HTL may include a hole transport material, e.g., 4,4'-bis[N-(1-naphtyl)-N-phenylamino]biphenyl (NPB), 4,4'-bis[N-(3-methylphenyl)-N-phenylamino]biphenyl (TPD), N,N'-di-1-naphtyl-N,N'-diphenyl-1,1'-biphenyl-4,4'-diamine (NPD), N-phenylcarbazole, polyvinylcarbazole, or any combination thereof. The ETL may include an electron transport material, e.g., tris(8-quinolinolato)aluminum (Alq3), 2-(4-biphenylyl)-5-4-tert-butylphenyl-1,3,4-oxadiazole (PBD), bis(2-methyl-8-quinolinolato)-4-phenylphenolato-aluminum (BAlq), bathocuproine (BCP), triazole (TAZ), phenylquinozaline, or any combination thereof.

In some embodiments, at least one of the organic light emitting layer, the HTL and ETL may be not individually patterned for each pixel, but may be commonly and continuously provided to a plurality of pixels. In one embodiment, the organic light emitting layer may be commonly and continuously provided to the pixels, and colors for each of the pixels may be implemented by color filters. In the embodiment, the transparent display device may be provided as a white-OLED (W-OLED) device.

In some embodiments, the display layer 200 may include a liquid crystal layer instead of the organic light emitting layer. In the embodiment, the transparent display device may be provided as a liquid crystal display (LCD) device.

The second electrode 210 may be disposed on the pixel defining layer 180 and the display layer 200. The second electrode 210 may face the first electrode 170. In some embodiments, the second electrode 210 may serve as a common electrode provided on the plurality of the pixels. The second electrode 210 may serve as a cathode of the transparent display device.

In some embodiments, the second electrode 210 may include a metal having a low work function such as Al, Ag, W, Cu, Ni, Cr, Mo, Ti, Pt, Ta, Nd, or Sc, or an alloy of the metals. In some embodiments, the second electrode 210 may include Ag, Mg or an alloy thereof (e.g., $Ag_xMg_{1-x}$).

The second electrode 210 may continuous extend on the pixel area PA and the transmission area TA. Alternatively, the second electrode 210 may be substantially eliminated on the transmission area TA.

A capping layer 220 may be on the second electrode 210. In some embodiments, the capping layer 220 may substantially cover the second electrode 210, and may be commonly and continuously provided on the pixel area PA and the transmission area TA.

The capping layer 220 may be an organic material having a preferred transmittance. In some embodiments, the capping layer 220 may include substantially the same as or similar material to the described hole transport material. Accordingly, emission efficiency at the pixel area PA may be not disturbed by the second electrode 210.

In some embodiments, as illustrated in FIG. 3, an encapsulation substrate 250 may be on the capping layer 220. Also, a packed layer 240 may further included between the capping layer 220 and the encapsulation substrate 250. The encapsulation substrate 250 may include an inorganic material such as silicon nitride and/or a metal oxide, for example. The packed layer 240 may include an organic material having transparency.

In some embodiments, organic/inorganic stacked layer may be used in an encapsulation film instead of the encapsulation substrate 250 and the packed layer 240. In some embodiments, a thin film encapsulation ("TFE") may be used as the encapsulation film.

As described above, the transparent display device may include the anti-diffraction layer 300 at the same layer as the first electrode 170, so that diffraction of the light of the transparent display device at the boundaries between the transmission area TA and the pixel area PA may be reduced and diffraction images that are displayed may be reduced. Accordingly, definition of the transparent display device may be improved.

FIGS. 4 through 12 are cross-sectional views for explaining stages in a method of manufacturing a transparent display device according to example embodiments. For example, FIGS. 4 through 12 illustrate a method of manufacturing the transparent display device of FIG. 3.

Figure 4:
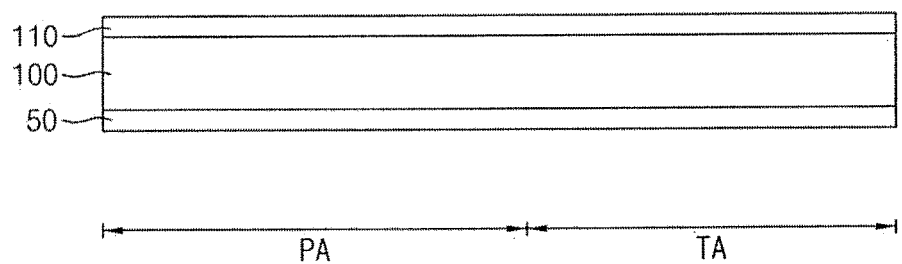
FIGS. 4 through 12 illustrate cross-sectional views for explaining stages in a method of manufacturing a transparent display device according to example embodiments.

Referring to FIG. 4, a substrate 100 may be formed on a carrier substrate 50, and a barrier layer 110 may be formed on the substrate 100. The carrier substrate 50 may serve as a support during processes for manufacturing the transparent display device. For example, a glass substrate or a metal substrate may be utilized as the carrier substrate 50.

The substrate 100 may be a glass substrate or include a transparent polymer material, e.g., polyimide-based resin. For example, a precursor composition containing a polyimide precursor may be coated on the carrier substrate 50 by, e.g., a spin coating process to form a coating layer. Then, the substrate 100 may be formed by a heat curing of the coating layer.

The polyimide precursor may include a diamine and a dianhydride. The precursor composition may be prepared by dissolving the polyimide precursor in an organic solvent. The organic solvent may include, e.g., N-methyl-2-pyrrolidone (NMP), dimethylformamide (DMF), tetrahydrofuran (THF), triethylamine (TEA), ethylacetate (ethylacetate), dimethylsulfoxide (DMSO), or an ethylene glycol-based ether solvent. These may be used alone or in a combination thereof.

A polymerization between the diamine and dianhydride may be guided by the heat curing process so that polyamic acid may be formed, which may be further cured. Then, dehydration condensation may proceed and a polyimide-based resin may be formed.

Some portion of the substrate 100 may be pixel area PA and the other portions of the substrate 100 may be defined as a transmission area TA. The barrier layer 110 may totally cover an upper surface of the substrate 100. The barrier layer 110 may be formed including silicon oxide, silicon nitride, and/or silicon oxynitride.

Figure 5:
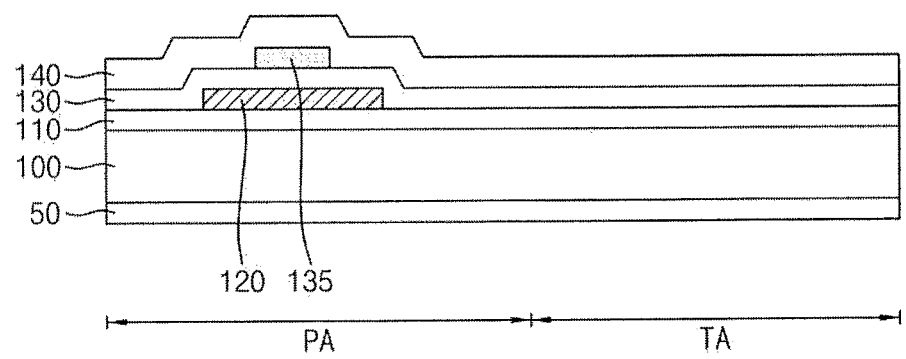

Referring to FIG. 5, an active pattern 120, a gate electrode 135, and additional insulation layers may be formed on the barrier layer 110. The active pattern 120 may be formed on a pixel area PA portion of the barrier layer 110. For example, a semiconductor layer may be formed on the barrier layer using amorphous silicon or polysilicon, and then may be patterned to form the active pattern 120. In some embodiments, a crystallization process, e.g., a low temperature polycrystalline silicon (LTPS) process or a laser crystallization process, may be further performed after the formation of the semiconductor layer. In some embodiments, the semiconductor layer may be formed of a semiconductor oxide such as IGZO, ZTO, or ITZO.

A gate insulation layer 130 covering the active pattern 120 may be formed on the barrier layer 110. The gate insulation layer 130 may be formed by solely or repeatedly depositing silicon oxide and silicon nitride.

As illustrated in FIG. 5, the gate insulation layer 130 may be commonly and continuously provided to the pixel area PA and transmission area TA. In some embodiments, the gate insulation layer 130 may be individually patterned to be formed on the pixel area PA.

The gate electrode 135 may be formed on the gate insulation layer to overlap the active pattern 120, e.g., in the third direction. For example, a first conductive layer may be formed on the gate insulation layer 130, and may be etched by, e.g., a photolithography process, to forint the gate electrode 135. The first conductive layer may be formed using a metal, an alloy, or a metal nitride. The first conductive layer may be formed by depositing a plurality of metal layers.

The gate electrode 135 may be formed simultaneously with the scan line S of FIG. 2. For example, the gate electrode 135, and the scan line S may be formed from the first conductive layer by substantially the same etching process. The scan line S may be integrally connected to the gate electrode 135.

In some embodiments, impurities may be implanted into the active pattern 120 using the gate electrode 135 as an ion-implantation mask such that a source region and a drain region may be formed at both ends of the active pattern 120.

The insulating interlayer 140 covering the gate electrode 135 may be formed on the gate insulation layer 130. The insulating interlayer 140 may include steps along profiles of the active pattern 120 and the gate electrode 135. The insulating interlayer 140 may include silicon oxide, silicon nitride, and/or silicon oxynitride. The insulating interlayer 140 may be commonly and continuously provided to the pixel area PA and the transmission area TA. In some embodiments, at least a portion of the insulating interlayer 140 formed on the transmission area TA may be eliminated.

Figure 6:
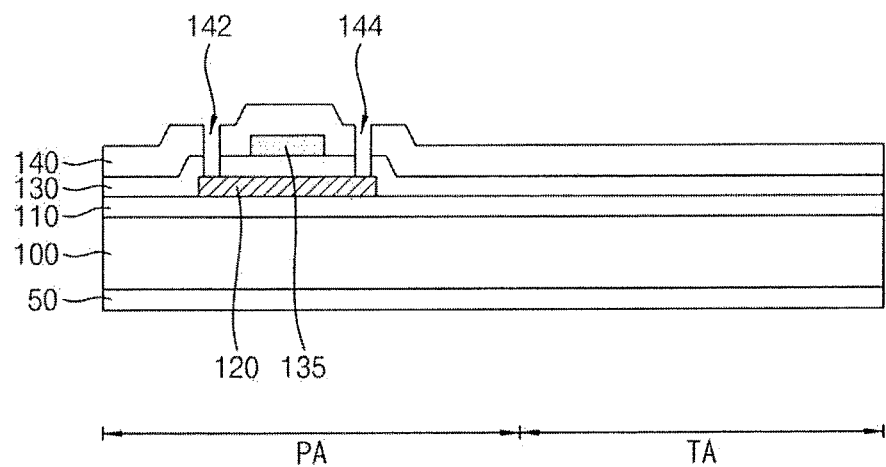

Referring to FIG. 6, the insulating interlayer 140 and the gate insulation layer 130 may be partially etched by a first photolithography process to form a first contact hole 142 and a second contact hole 144.

The first and second contact holes 142 and 144 may penetrate insulating interlayer 140 and the gate insulation layer 130 to partially expose portions of an upper surface of the active pattern 120. For example, the source region and the drain region of the active pattern 120 may be exposed through the first and second contact holes 142 and 144, respectively.

Figure 7:
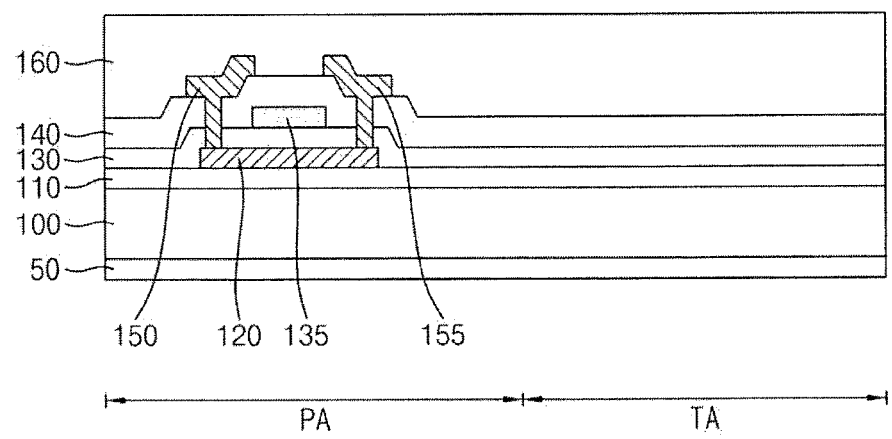

Referring to FIG. 7, the source electrode 150 and the drain electrode 155 may be formed in the first and second contact holes 142 and 144, respectively. The source electrode 150 and the drain electrode 155 may be in contact with the source region and the drain region, respectively.

For example, a second conductive layer filling the first and second contact holes 142 and 144 may be formed on the insulating interlayer 140, and then may be patterned by a photolithography process to form the source electrode 150 and the drain electrode 155. The second conductive layer may be formed using a metal, an alloy or a metal nitride.

By performing the above-mentioned processes, a transistor, e.g., a TFT, including the source electrode 150, the drain electrode 155, the gate electrode 135, the gate insulation layer 130, and the active pattern 120 may be formed on the pixel area PA of the substrate 100. For example, the pixel area PA may include a plurality of pixels as illustrated in FIGS. 1 and 2, and at least one the transistor may be formed in each of the pixels.

A pixel circuit including the transistor, the data line D, the scan line S may be formed on the substrate 100. The source electrode 150 may be formed to be connected to the data line D of FIG. 2. For example, the source electrode 150, the drain electrode 155, and the data line D may be farmed by the same photolithography process to the second conductive layer.

Then, the via insulation layer 160 covering the insulating interlayer 140, the gate insulation layer 130, the source electrode 150, and the drain electrode 155 may be formed. The via insulation layer 160 may be commonly and continuously extended on the pixel area PA and the transmission area TA. The via insulation layer 160 may have a sufficient thickness to have a substantially level or planar top surface. Thus, the via insulation layer 160 may be provided as a planarization layer of the transparent display device of the back plane structure.

The via insulation layer 160 may be formed by a spin coating process or a slit coating process using a transparent organic material such as polyimide, an epoxy-based resin, an acryl-based resin, or polyester, for example.

Figure 8:
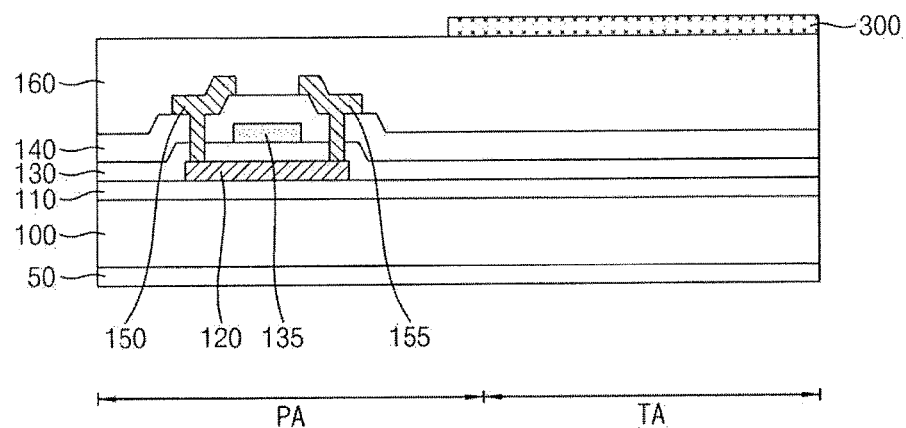

Referring to FIG. 8, an anti-diffraction layer 300 may be formed on the via insulation layer 160. At least a portion of the anti-diffraction layer 300 may overlap the transmission area TA, e.g., in the third direction.

For example, a solution including a plurality of nano wires that are dispersed may be applied on the transmission area TA of the via insulation layer 160. Then, a heat treatment process may be performed to the applied solution to form the anti-diffraction layer 300.

In some embodiments, the nano wires may include metal or nonmetal. For example, the nano wires may include nickel (Ni), platinum (Pt), gold (Au), or silver (Ag). The nano wires may include carbon nano tube. The nano wires may include silicon (Si), Indium-phosphide (InP), gallium nitride (GaN), silicon oxide ($SiO_2$), titanium oxide ($TiO_2$), and so on.

The solution may further include a solvent such as pure alcohol or organic solvent. The solvent may be volatilized by the heat treatment process. The solution may further include a surfactant. After the solvent is volatilized, the surfactant may be attached to a surface of each of the nano wires so that dispersibility of the nano wires may be increased. The solution may further include organic enrichment. After the solvent is volatilized, adhesive strength between the nano wires may be increased. For example, the solution may be applied on the via insulation layer 160 using a spin coating apparatus, a slit coating apparatus, or bar coating apparatus.

Figure 9:
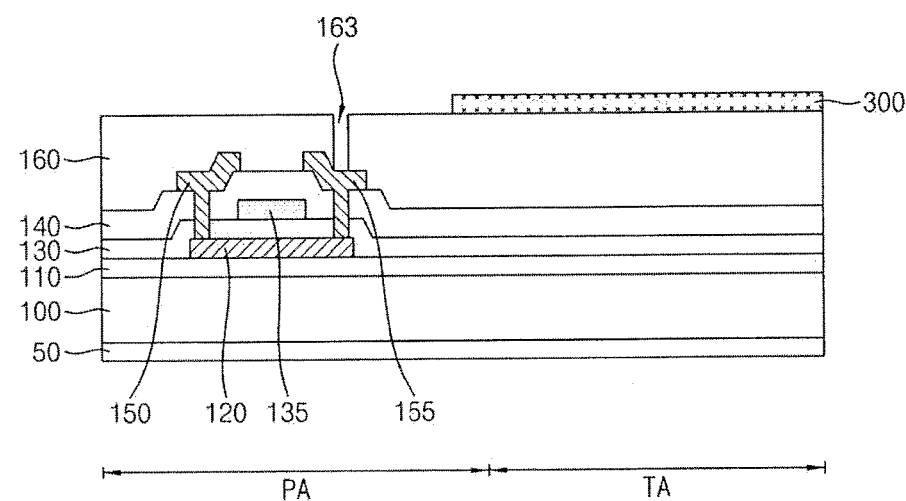

Referring to FIG. 9, a via hole 163 may be formed by removing a portion of the via insulation layer 160 through a second photolithography process. In some embodiments, at least a portion of an upper surface of the drain electrode 155 may be exposed.

Figure 10:
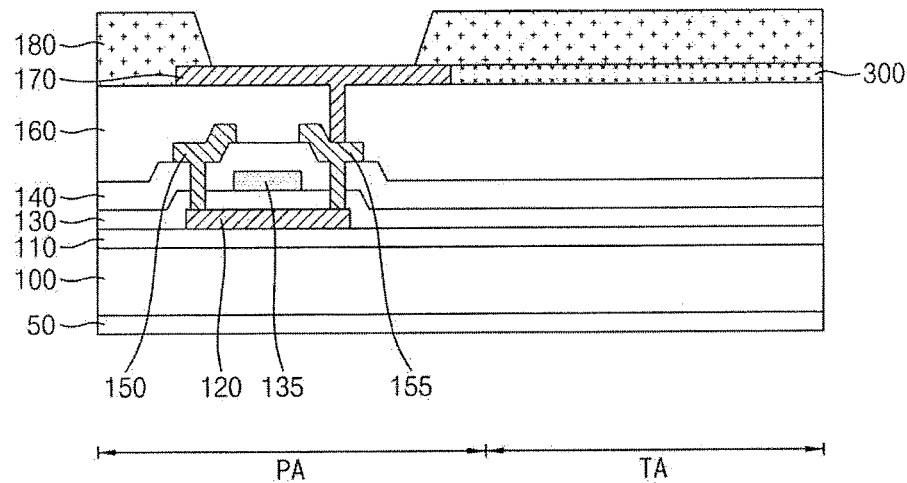

Referring to FIG. 10, a first electrode 170 may be formed on the via insulation layer 160 to form the back plane structure. The first electrode 170 may be disposed on the same layer as the anti-diffraction layer 300.

For example, a third conductive layer sufficiently filling the via hole 163 may be formed on the via insulation layer 160 and the drain electrode 155 that are not covered by the anti-diffraction layer 300, and then may be patterned to form the first electrode 170. The first electrode 170 may be provided as a pixel electrode and/or an anode of the transparent display device. A portion of the first electrode 170 formed in the via hole 163 may be defined as a via structure connected to the drain electrode 155.

The third conductive layer may be formed using a metal such as Al, Ag, W, Cu, Ni, Cr, Mo, Ti, Pt, Ta, Nd, or Sc, or an alloy of the metals.

Meanwhile, described barrier layer 110, the active pattern 120, the gate insulation layer 130, the insulating interlayer 140, and the first to third conductive layers may be formed by at least one of Chemical Vapor Deposition ("CVD") process, plasma enhanced chemical vapor deposition ("PECVD") process, high density plasma-chemical vapor deposition ("HDP-CVD") process, sputtering process, Physical Vapor Deposition ("PVD"), Atomic Layer Deposition ("ALD"), a thermal evaporation process, a vacuum deposition process, a printing process, etc.

A pixel defining layer 180 partially covering an upper surface of the first electrode 170 may be formed on the anti-diffraction layer 300. For example, a photosensitive organic material such as a polyimide resin or an acryl resin may be coated, and then exposure and developing processes may be performed to form the pixel defining layer 180. In some embodiments, the pixel defining layer 180 may be formed by a printing process such as an inkjet printing process using polymer or inorganic material.

Figure 11:
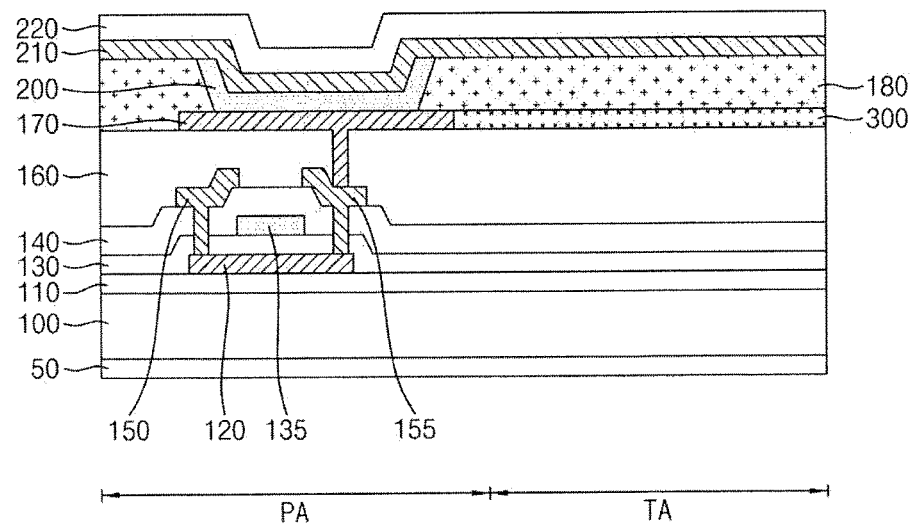

Referring to FIG. 11, the display layer 200, the second electrode 210, and the capping layer 220 may be sequentially stacked on the pixel defining layer 180 and the first electrode 170.

The display layer 200 may be formed on the first electrode 170 exposed by the pixel defining layer 180 for each pixel using an organic light emitting material for generating a red color of light, a blue color of light or a green color of light. For example, the display layer 180 may be formed by a spin coating process, a roll printing process, a nozzle printing process, an inkjet process, etc., using a fine metal mask (FMM) that may include an opening through which a region corresponding to a red pixel, a green pixel, or a blue pixel is exposed. Accordingly, an organic emitting layer including the organic light emitting material may be individually formed in each pixel.

In some embodiments, an HTL may be formed before the formation of the organic emitting layer using the above-mentioned hole transport material. An ETL may be also formed on the organic emitting layer using the above-mentioned electron transport material. The ETL or the ETL may be patterned or printed per each pixel by processes substantially the same as or similar to those for the organic emitting layer.

For example, as illustrated in FIG. 11, the display layer for each pixel may be limited by sidewalls of the pixel defining layer 180.

In some embodiments, at least one of the organic light emitting layer, the HTL, and the ETL may be not pattern per each pixel. At least one of the organic light emitting layer, the HTL, and the ETL may be commonly formed on the plurality of pixels. In one embodiment, the organic light emitting layer may be commonly formed on the plurality of pixels, and a color for each of the pixels may be implemented by a color filter. In the embodiment, the transparent display device may be provided as a W-OLED (White-OLED) device.

A metal having a low work function such as Al, Ag, W, Cu, Ni, Cr, Mo, Ti, Pt, Ta, Nd, or Sc, or an alloy of the metals may be deposited on the display layer 200 to form a second electrode 210. The second electrode 210 may be provided as a common electrode and/or cathode of the transparent display device.

For example, a mask, including an opening through which a plurality of the pixels are commonly exposed, may be used to deposit the metal for the formation of the second electrode 210. The second electrode 210 may be commonly formed on the pixel area PA and the transmission area TA without any additional patterning process.

In contrast, the second electrode 210 may be patterned to be substantially eliminated on the transmission area TA. In some embodiments, the second electrode 210 may include Ag, Mg or an alloy thereof.

Then, the capping layer 220 may be formed on the second electrode 210. In some embodiments, the capping layer 220 may be commonly and continuously formed on the pixel area PA and the transmission area TA.

For example, the capping layer 220 may be formed by the coating process such as the spin coating process using inorganic material such as described hole transport material.

Figure 12:
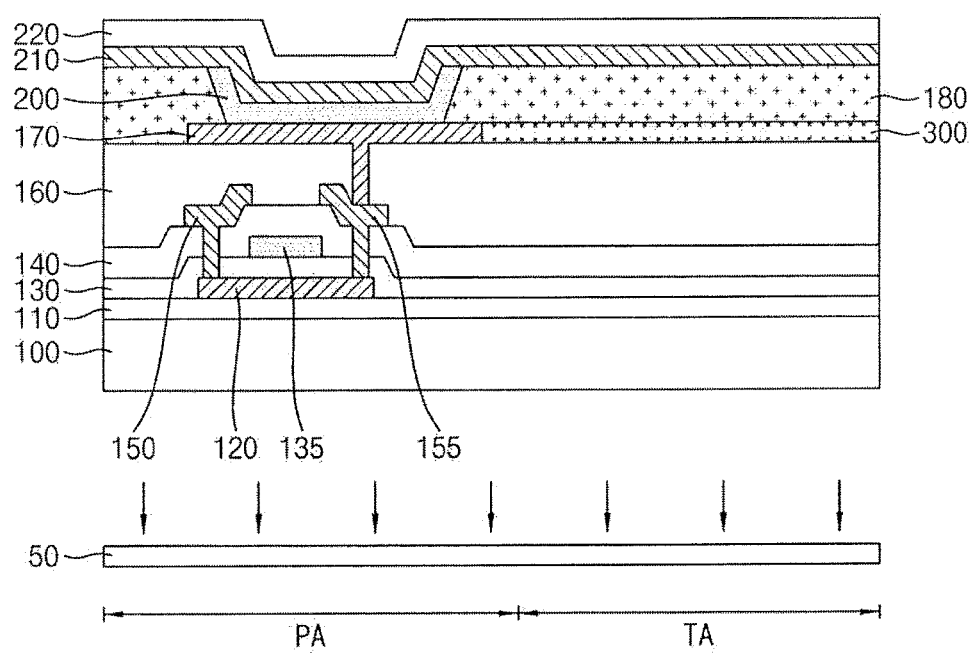

Then, as illustrated in FIG. 12, the carrier substrate 50 may be detached from the substrate 100. For example, a laser-lift process may be performed to separate the carrier substrate 50 from the substrate 100. Alternatively, a mechanical tension may be applied to detach the carrier substrate 50 without performing the laser-lift process.

In some embodiments, as illustrated in FIG. 3, the packed layer 240 and the encapsulation substrate 250 may be sequentially stacked on the capping layer 220. In contrast, organic/inorganic stacked layer may be used in an encapsulation film instead of the encapsulation substrate 250 and the packed layer 240. For example, a thin film encapsulation ("TFE") may be used as the encapsulation film.

As described above, the method of manufacturing the transparent display device may form the anti-diffraction layer 300 at the same layer as the first electrode 170. Accordingly, diffraction of the light of the transparent display device at the boundaries between the transmission area TA and the pixel area PA may be reduced and diffraction images that are displayed may be reduced. Thus, definition of the transparent display device may be improved.

Figure 13:
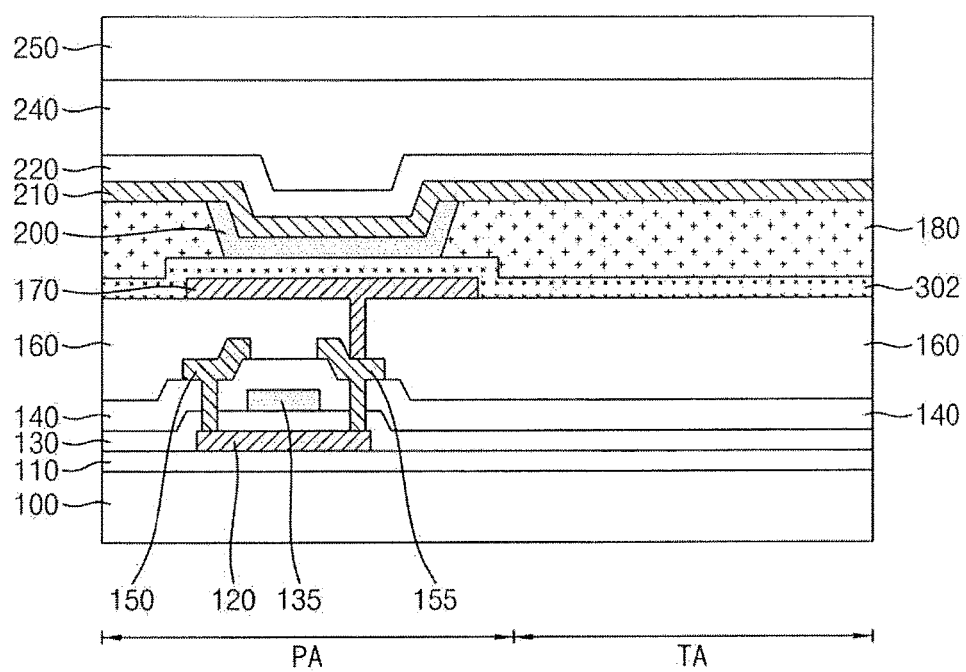
FIG. 13 illustrates a cross-sectional diagram of an example of a transparent display device.

FIG. 13 is a cross-sectional diagram illustrating an example of a transparent display device. The transparent display device of the present example embodiments are substantially the same as or similar to the transparent display device explained with reference to FIG. 3, except for the extent of an anti-diffraction layer. Thus, the same reference numerals will be used to refer to the same or like parts as those described in the example embodiments of FIGS. 1 to 12, and any repetitive explanation concerning the above elements will be omitted.

Referring to FIG. 13, at least a portion (e.g., a first portion) of an anti-diffraction layer 302 may be disposed at the same layer as the first electrode 170, and a second portion of the anti-diffraction layer 302 may cover the first electrode 170. For example, the anti-diffraction layer 302 may be continuously disposed along a surface of the first electrode 170 and a surface of the via insulation layer 160 that is not covered by the first electrode 170.

In some embodiments, the anti-diffraction layer 302 may overlap the pixel area PA and the transmission area TA, and may be continuously and commonly disposed on the pixel area PA and the transmission area TA. For example, the anti-diffraction layer 302 may be individually provided per each display area DA. In contrast, the anti-diffraction layer 302 may be commonly provided to a plurality of display areas DA. In some embodiments, the anti-diffraction layer 302 may include a plurality of nano wires randomly arranged in a network structure.

A back plane ("BP") structure may be defined by the pixel circuit, the insulation layers, the first electrode 170, and the anti-diffraction layer 302 that are formed on the substrate 100. The back plane structure may further include a pixel defining layer 180. The pixel defining layer 180 may be formed on the anti-diffraction layer 302 to cover at least a portion of an upper surface of the first electrode 170. The pixel defining layer 180 may be not in contact with the first electrode 170.

Each pixel in the pixel area PA may be exposed by the pixel defining layer 180. An area of the portion of the first electrode 180 that is not covered by the pixel defining layer 180 may substantially correspond to an emission area of each pixel. In some embodiments, the pixel defining layer 180 may be extended to the transmission area TA.

The display layer 200 may be on the second portion of the anti-diffraction layer 302 (that covers the first electrode 170) and the pixel defining layer 180. For example, the display layer 200 may be on sidewalls of the pixel defining layer 180 and a portion of an upper surface of the anti-diffraction layer 302 exposed by the pixel defining layer 180.

According to the transparent display device of the present example embodiments, the anti-diffraction layer 302 disposed on the via insulation layer 160 may cover the first electrode 170. Thus, the anti-diffraction layer 302 may commonly overlap the pixel area PA and the transmission area TA. Accordingly, the light diffraction in the transparent display device may be more effectively reduced and definition of the transparent display device may be improved.

Figure 14:
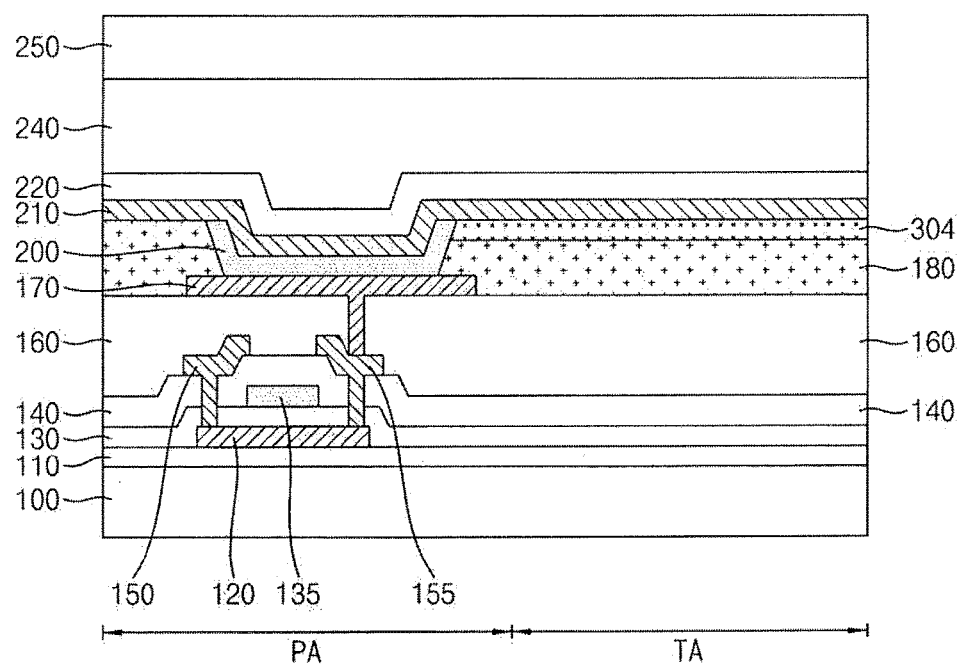
FIG. 14 illustrates a cross-sectional diagram of another example of a transparent display device.

FIG. 14 is a cross-sectional diagram illustrating another example of a transparent display device. The transparent display device of the present example embodiments are substantially the same as or similar to the transparent display device explained with reference to FIG. 3 except for position of an anti-diffraction layer. Thus, the same reference numerals will be used to refer to the same or like parts as those described in the example embodiments of FIGS. 1 to 12, and any repetitive explanation concerning the above elements will be omitted.

The pixel defining layer 180 may be formed on the via insulation layer 160. The pixel defining layer 180 may cover a peripheral portion of the first electrode 170. An anti-diffraction layer 304 may be on the pixel defining layer 180. The anti-diffraction layer 304 may overlap the transmission area TA.

In some embodiments, the anti-diffraction layer 304 may include a plurality of nano wires randomly arranged in a network structure. The anti-diffraction layer 304 may reduce or prevent light that pass boundaries between the transmission area TA and the pixel area PA from diffracting. Thus, the anti-diffraction layer 304 may reduce diffraction images that are displayed.

The display layer 200 may be on the anti-diffraction layer 304, the pixel defining layer 180, and the first electrode 170. For example, the display layer 200 may be on sidewalls of the anti-diffraction layer 304, sidewalls of the pixel defining layer 180, and a portion of an upper surface of first electrode 170 exposed by the pixel defining layer 180.

The second electrode 210 may be on the anti-diffraction layer 304 and the display layer 200. The second electrode 210 may face the first electrode 170.

The second electrode 210 may be commonly and continuously extended on the pixel area PA and the transmission area TA. In contrast, the second electrode 210 may be substantially eliminated on the transmission area TA.

According to the transparent display device of the present example embodiments, the anti-diffraction layer 304 may be on the pixel defining layer 180. Thus, diffraction of the light of the transparent display device at the boundaries between the transmission area TA and the pixel area PA may be reduced and diffraction images that are displayed may be reduced. Accordingly, definition of the transparent display device may be improved.

Figure 15:
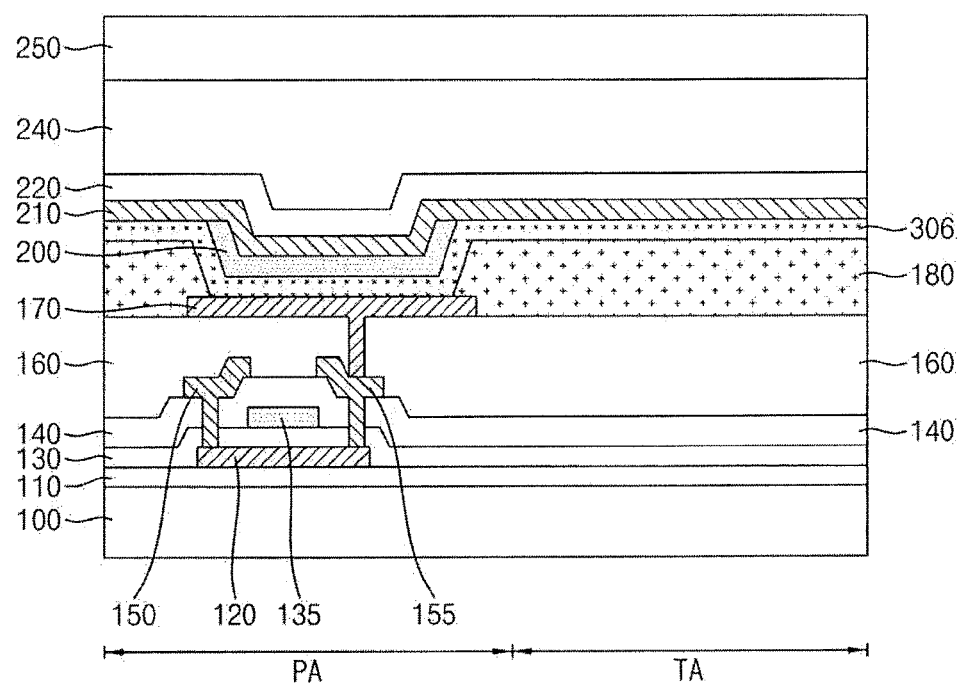
FIG. 15 illustrates a cross-sectional diagram of still another example of a transparent display device.

FIG. 15 is a cross-sectional diagram illustrating still another example of a transparent display device. The transparent display device of the present example embodiments are substantially the same as or similar to the transparent display device explained with reference to FIG. 14 except for disposition of an anti-diffraction layer 306. Thus, the same reference numerals will be used to refer to the same or like parts as those described in the example embodiments of FIGS. 1 to 12, and any repetitive explanation concerning the above elements will be omitted.

A first portion of the anti-diffraction layer 306 may be on the pixel defining layer 180. The first portion of the anti-diffraction layer 306 may overlap the transmission area TA. A second portion of the anti-diffraction layer 306 may be disposed on the pixel defining layer 180 and the first electrode 170. The second portion of the anti-diffraction layer 306 may overlap the pixel area PA.

For example, the first portion of the anti-diffraction layer 306 may be on an upper surface of the pixel defining layer 180. The second portion of the anti-diffraction layer 306 may be disposed on a sidewall of the pixel defining layer 180 and an upper surface of the first electrode 180 exposed by the pixel defining layer 180.

Specifically, the anti-diffraction layer 306 may be along surfaces of the pixel defining layer 180 and the first electrode 170. In some embodiments, the anti-diffraction layer 306 may include a plurality of nano wires randomly arranged in a network structure. The anti-diffraction layer 306 may reduce or prevent light that pass boundaries between the transmission area TA and the pixel area PA from diffracting. Thus, the anti-diffraction layer 306 may reduce diffraction images that are displayed.

The display layer 200 may be at least partially disposed on the second portion of the anti-diffraction layer 306. For example, the display layer 200 may be on an upper surface and sidewalls of the anti-diffraction layer 306.

The second electrode 210 may be on the anti-diffraction layer 306 and the display layer 200. The second electrode 210 may face the first electrode 170. The second electrode 210 may be commonly and continuously extended on the pixel area PA and the transmission area TA. In contrast, the second electrode 210 may be substantially eliminated on the transmission area TA.

According to the transparent display device of the present example embodiments, the anti-diffraction layer 306 may be disposed on the pixel defining layer 180 and the first electrode 170. Thus, diffraction of the light of the transparent display device at the boundaries between the transmission area TA and the pixel area PA may be reduced and diffraction images that are displayed may be reduced. Accordingly, definition of the transparent display device may be improved.

Figure 16:
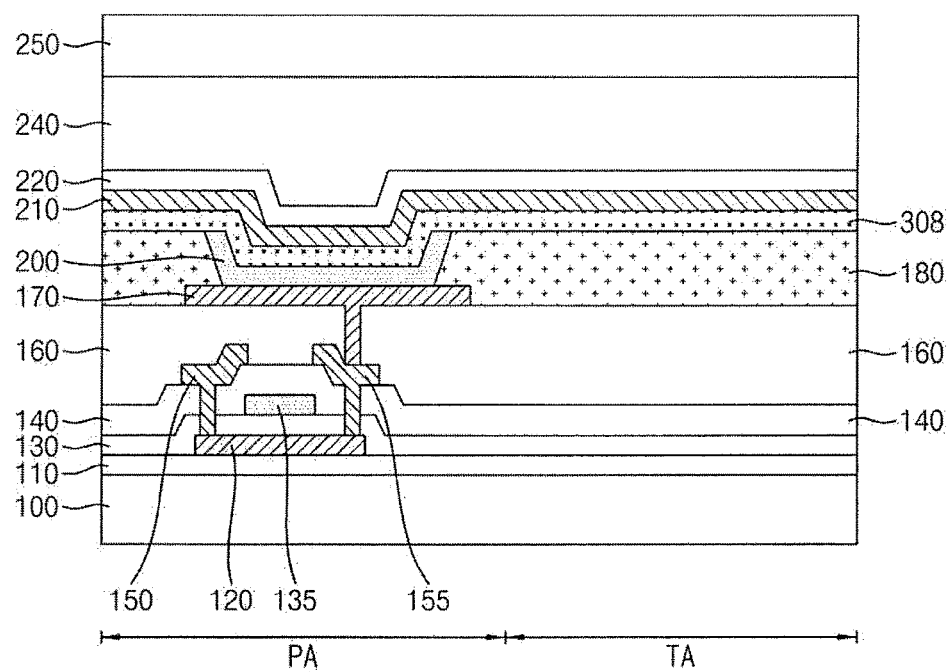
FIG. 16 illustrates a cross-sectional diagram of further still another example of a transparent display device.

FIG. 16 is a cross-sectional diagram illustrating further still another example of a transparent display device. The transparent display device of the present example embodiments are substantially the same as or similar to the transparent display device explained with reference to FIG. 14 except for disposition of an anti-diffraction layer 308. Thus, the same reference numerals will be used to refer to the same or like parts as those described in the example embodiments of FIGS. 1 to 12, and any repetitive explanation concerning the above elements will be omitted.

The display layer 200 may be disposed on the pixel defining layer 180 and the first electrode 170. For example, the display layer 200 may be disposed on sidewalls of the pixel defining layer 180 and an upper surface of the first electrode 170 that is exposed by the pixel defining layer 180.

A first portion of the anti-diffraction layer 308 may be disposed on the pixel defining layer 180. The first portion of the anti-diffraction layer 308 may overlap the transmission area TA. A second portion of the anti-diffraction layer 308 may be disposed on the display layer 200. The second portion of the anti-diffraction layer 308 may overlap the pixel area PA.

For example, the first portion of the anti-diffraction layer 308 may be disposed on an upper surface of the pixel defining layer 180. The second portion of the anti-diffraction layer 308 may be on a sidewall and an upper side of the display layer 200. Specifically, the anti-diffraction layer 308 may be continuously disposed along surfaces of the pixel defining layer 180 and the upper side of the display layer 200.

In some embodiments, the anti-diffraction layer 308 may include a plurality of nano wires randomly arranged in a network structure. The anti-diffraction layer 308 may reduce or prevent light that pass boundaries between the transmission area TA and the pixel area PA from diffracting. Thus, the anti-diffraction layer 308 may reduce diffraction images that are displayed.

Figure 17:
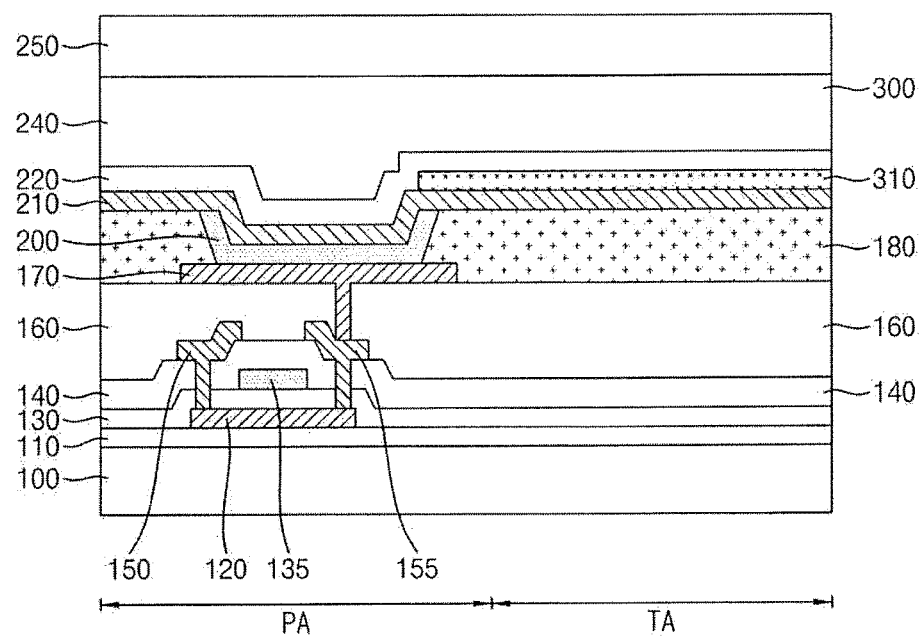
FIG. 17 illustrates a cross-sectional diagram of further still another example of a transparent display device.

FIG. 17 is a cross-sectional diagram illustrating further still another example of a transparent display device. The transparent display device of the present example embodiments are substantially the same as or similar to the transparent display device explained with reference to FIG. 14 except for disposition of an anti-diffraction layer 310. Thus, the same reference numerals will be used to refer to the same or like parts as those described in the example embodiments of FIGS. 1 to 12, and any repetitive explanation concerning the above elements will be omitted.

The display layer 200 may be disposed on the pixel defining layer 180 and the first electrode 170. For example, the display layer 200 may be disposed on sidewalls of the pixel defining layer 180 and an upper surface of the first electrode 170 that is exposed by the pixel defining layer 180.

The second electrode 210 may be on the pixel defining layer 280 and the display layer 200. The second electrode 210 may face the first electrode 170. The second electrode may be continuously extended on the pixel area PA and the transmission area TA. In contrast, the second electrode 210 may be substantially eliminated on the transmission area TA.

The anti-diffraction layer 310 may be on the second electrode 210. The anti-diffraction layer 310 may overlap the transmission area TA. In some embodiments, the anti-diffraction layer 310 may include a plurality of nano wires randomly arranged in a network structure. The anti-diffraction layer 310 may reduce or prevent light that pass boundaries between the transmission area TA and the pixel area PA from diffracting. Thus, the anti-diffraction layer 310 may reduce diffraction images that are displayed.

The capping layer 220 may be on a sidewall and an upper side of the anti-diffraction layer 310 and an upper side of the second electrode that is not covered by the anti-diffraction layer 310.

According to the transparent display device of the present example embodiments, the anti-diffraction layer 310 may be disposed on the second electrode 210. Thus, diffraction of the light of the transparent display device at the boundaries between the transmission area TA and the pixel area PA may be reduced and diffraction images that are displayed may be reduced. Accordingly, definition of the transparent display device may be improved.

Figure 18:
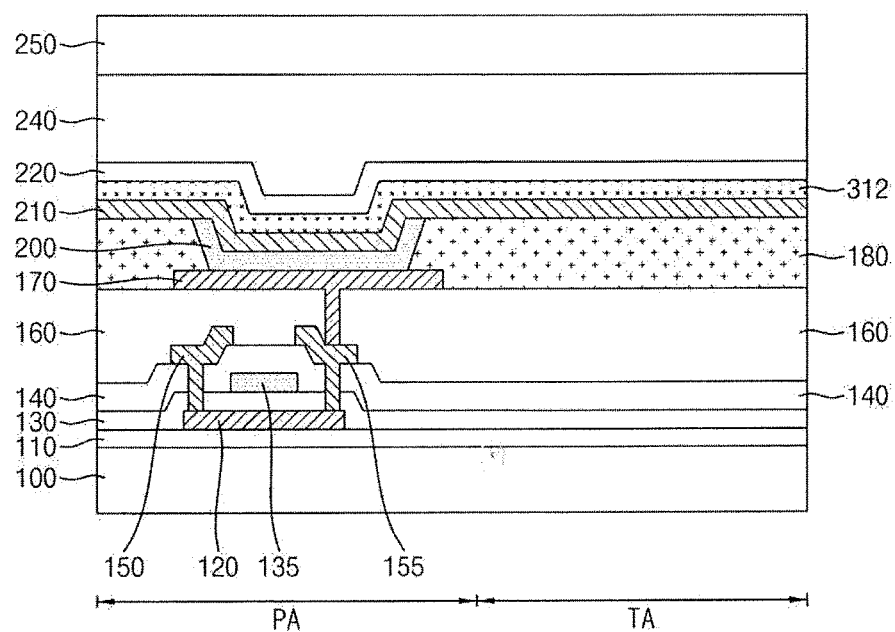
FIG. 18 illustrates a cross-sectional diagram of further still another example of a transparent display device.

FIG. 18 is a cross-sectional diagram illustrating further still another example of a transparent display device. The transparent display device of the present example embodiments is substantially the same as or similar to the transparent display device explained with reference to FIG. 17 except for disposition of an anti-diffraction layer 312. Thus, the same reference numerals will be used to refer to the same or like parts as those described in the example embodiments of FIGS. 1 to 12, and any repetitive explanation concerning the above elements will be omitted.

The anti-diffraction layer 312 may be disposed on the pixel area PA and the transmission area TA along a surface of the second electrode 210. For example, the anti-diffraction layer 312 may be individually patterned per each display area DA. In contrast, the anti-diffraction layer 312 may be commonly provided to a plurality of display areas DA.

In some embodiments, the anti-diffraction layer 312 may include a plurality of nano wires randomly arranged in a network structure. The anti-diffraction layer 312 may reduce or prevent light that pass boundaries between the transmission area TA and the pixel area PA from diffracting. Thus, the anti-diffraction layer 312 may reduce diffraction images that are displayed. The capping layer 220 may be continuously disposed along the surface of the anti-diffraction layer 312.

According to the transparent display device of the present example embodiments, the anti-diffraction layer 312 may be disposed on the second electrode 210. Thus, diffraction of the light of the transparent display device at the boundaries between the transmission area TA and the pixel area PA may be reduced and diffraction images that are displayed may be reduced. Accordingly, definition of the transparent display device may be improved.

Figure 19:
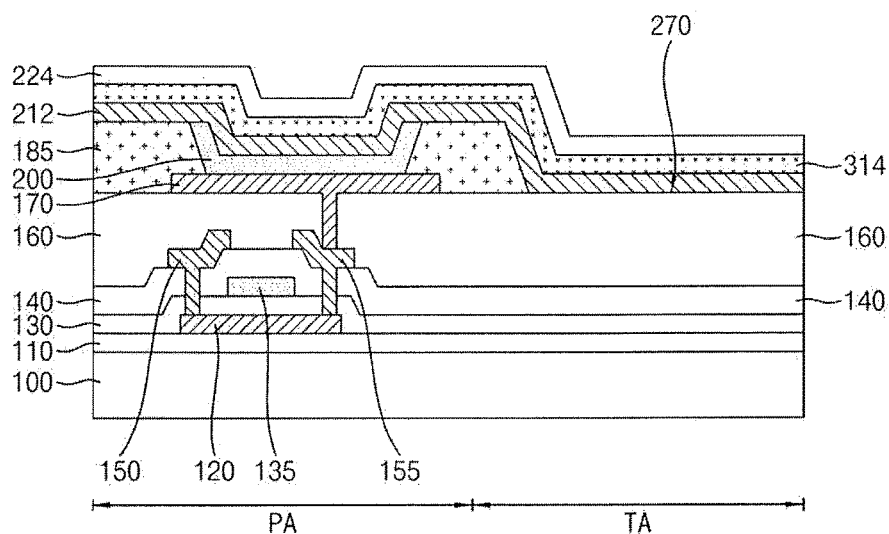
FIG. 19 illustrates a cross-sectional diagram of further still another example of a transparent display device.

FIG. 19 is a cross-sectional diagram illustrating further still another example of a transparent display device. The transparent display device of the present example embodiments is substantially the same as or similar to the transparent display device explained with reference to FIG. 18 except for disposition of a pixel defining layer 185. Thus, the same reference numerals will be used to refer to the same or like parts as those described in the example embodiments of FIGS. 1 to 12, and any repetitive explanation concerning the above elements will be omitted.

The pixel defining layer 185 may be substantially eliminated on the transmission area TA. For example, the pixel defining layer 185 may be selectively printed to be disposed on a boundary area between the pixel area PA and the transmission area TA, and a boundary between adjacent display areas illustrated in FIG. 1.

In some embodiments, a transmitting window 270 may be defined by an upper surface of the via insulation layer 160 and a sidewall of the pixel defining layer 185 on the transmission area TA. Transmittance at the transmission area TA may be improved as the transmitting window 270 is formed by the pixel defining layer 185.

A second electrode 212, an anti-diffraction layer 314, and a capping layer 224 may be sequentially and continuously stacked along the surfaces of the pixel defining layer 185, the display layer 200, and the via insulation layer 160. For example, the second electrode 212, the anti-diffraction layer 314, and the capping layer 224 may be formed on the second electrode 212 through the pixel area PA and the transmission area TA.

According to the transparent display device of the present example embodiments, the anti-diffraction layer 314 may reduce or prevent light that passes through boundaries between the transmission area TA and the pixel area PA from interfering. Thus, the anti-diffraction layer 314 may reduce diffraction images that are displayed. Further, portions of the pixel defining layer are eliminated so that the transmittance at the transmission area TA may be improved.

Figure 20:
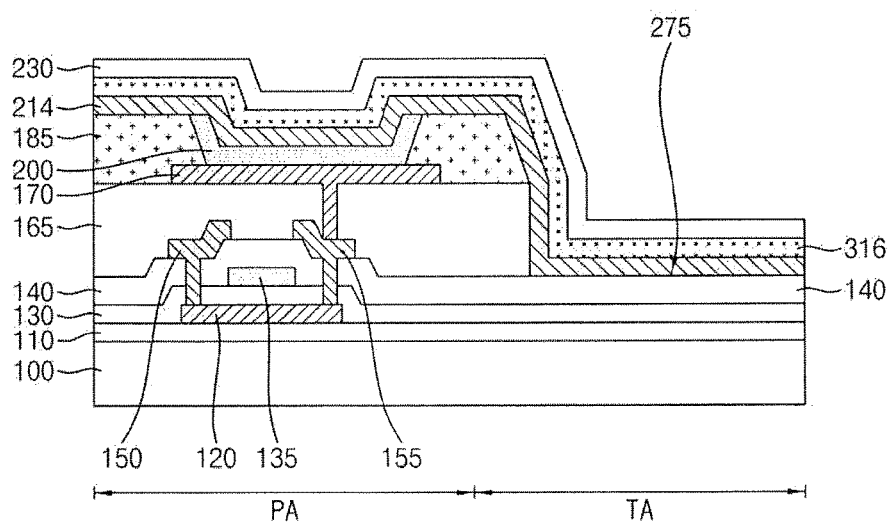
FIG. 20 illustrates a cross-sectional diagram of further still another example of a transparent display device.

FIG. 20 is a cross-sectional diagram illustrating further still another example of a transparent display device. The transparent display device of the present example embodiments is substantially the same as or similar to the transparent display device explained with reference to FIG. 19 except for dispositions of a via insulation layer 165. Thus, the same reference numerals will be used to refer to the same or like parts as those described in the example embodiments of FIGS. 1 to 12, and any repetitive explanation concerning the above elements will be omitted.

Referring to FIG. 20, a portion of the via insulation layer in the transmission area TA of FIG. 19 may be eliminated. Accordingly, the via insulation layer pattern 165 may be selectively disposed on the pixel area PA for covering a transistor or a pixel circuit. For example, a transmitting window 275 may be defined by an upper surface of the insulating interlayer 140, and sidewalls of the pixel defining layer 185 and via insulation layer pattern 165.

A second electrode 214, an anti-diffraction layer 316, and a capping layer 230 may be sequentially and continuously formed along the surfaces of the pixel defining layer 185, the display layer 200, and the transmitting window 275.

According to the transparent display device of the present example embodiments, the anti-diffraction layer 316 may reduce or prevent light that pass boundaries between the transmission area TA and the pixel area PA from diffracting. Thus, the anti-diffraction layer 316 may reduce diffraction images that are displayed. Further, portions of the via insulation layer are eliminated so that the transmittance at the transmission area TA may be improved.

Figure 21:
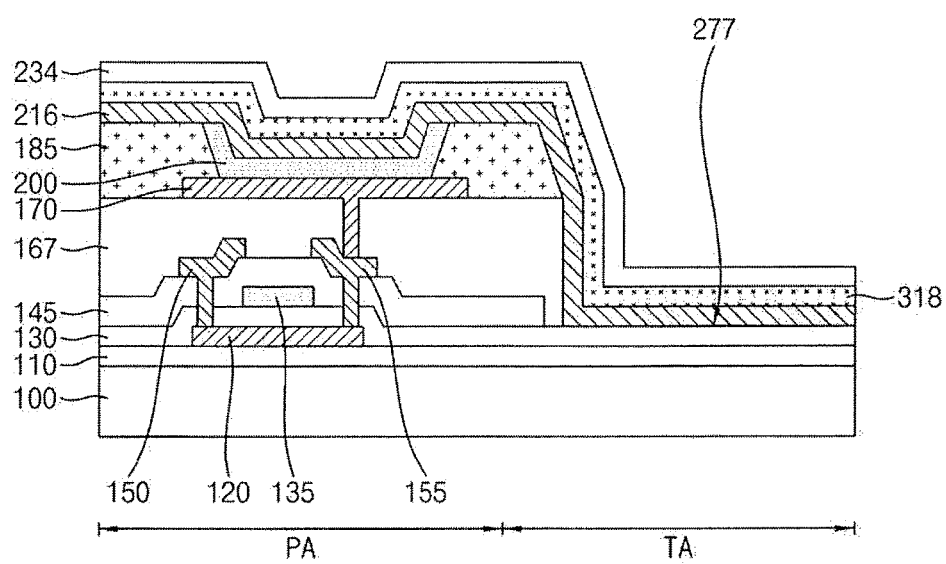
FIG. 21 illustrates a cross-sectional diagram of further still another example of a transparent display device.

FIG. 21 is a cross-sectional diagram illustrating further still another example of a transparent display device. The transparent display device of the present example embodiments is substantially the same as or similar to the transparent display device explained with reference to FIG. 20 except for disposition of an insulating interlayer 145. Thus, the same reference numerals will be used to refer to the same or like parts as those described in the example embodiments of FIGS. 1 to 12, and any repetitive explanation concerning the above elements will be omitted.

Referring to FIG. 21, a portion of the insulating interlayer corresponding to the transmission area TA of FIG. 20 may be eliminated. Accordingly, the insulating interlayer pattern 145 may be selectively disposed on the pixel area PA for covering a transistor or a pixel circuit.

In some embodiments, the insulating interlayer pattern 145 may be included in the via insulation layer pattern 167. In the embodiments, a transmitting window 277 may be defined by an upper surface of the gate insulation layer 130 and sidewalls of the pixel defining layer 185 and the via insulation layer pattern 167.

A second electrode 216, an anti-diffraction layer 318, and a capping layer 234 may be sequentially and continuously formed along the surfaces of the pixel defining layer 185, the display layer 200, and the transmitting window 277.

According to the transparent display device of the present example embodiments, the anti-diffraction layer 318 may reduce or prevent light that pass boundaries between the transmission area TA and the pixel area PA from diffracting. Thus, the anti-diffraction layer 318 may reduce diffraction images that are displayed. Further, portions of the insulating interlayer are eliminated so that the transmittance at the transmission area TA may be improved.

Figure 22:
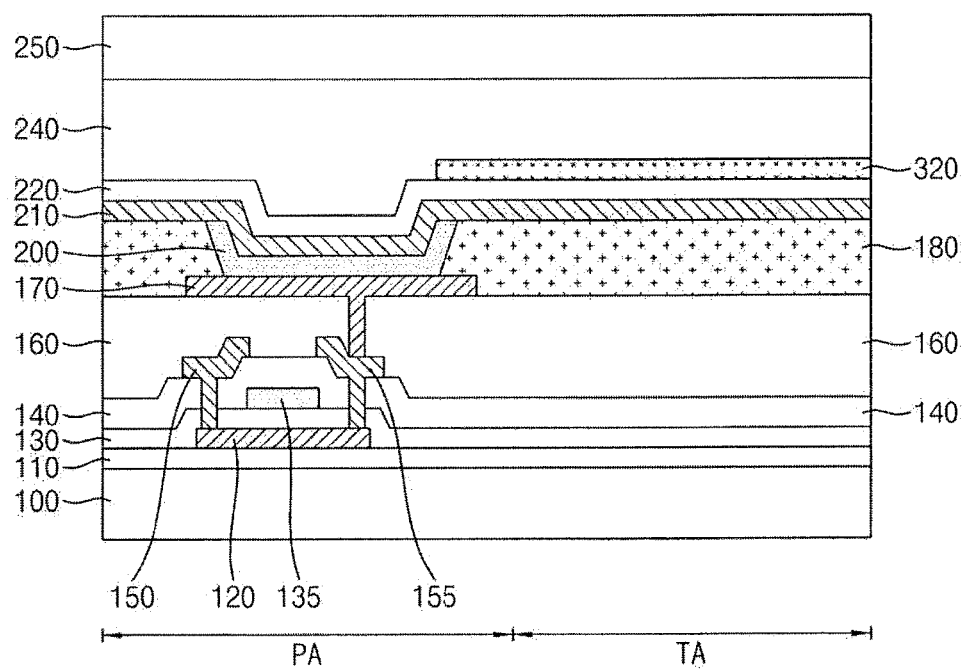
FIG. 22 illustrates a cross-sectional diagram of further still another example of a transparent display device.

FIG. 22 is a cross-sectional diagram illustrating further still another example of a transparent display device. The transparent display device of the present example embodiments is substantially the same as or similar to the transparent display device explained with reference to FIG. 17 except for disposition of an anti-diffraction layer 320. Thus, the same reference numerals will be used to refer to the same or like parts as those described in the example embodiments of FIGS. 1 to 12, and any repetitive explanation concerning the above elements will be omitted.

The capping layer 220 may be continuously disposed along a surface of the second electrode 210. The anti-diffraction layer 320 may be disposed on the capping layer 220. The anti-diffraction layer 320 may overlap the transmission area TA. In some embodiments, the anti-diffraction layer 320 may include a plurality of nano wires randomly arranged in a network structure.

According to the transparent display device of the present example embodiments, the anti-diffraction layer 320 on the capping layer 220 may reduce or prevent light that passes through boundaries between the transmission area TA and the pixel area PA from diffracting. Thus, the anti-diffraction layer 320 may reduce diffraction images that are displayed.

Figure 23:
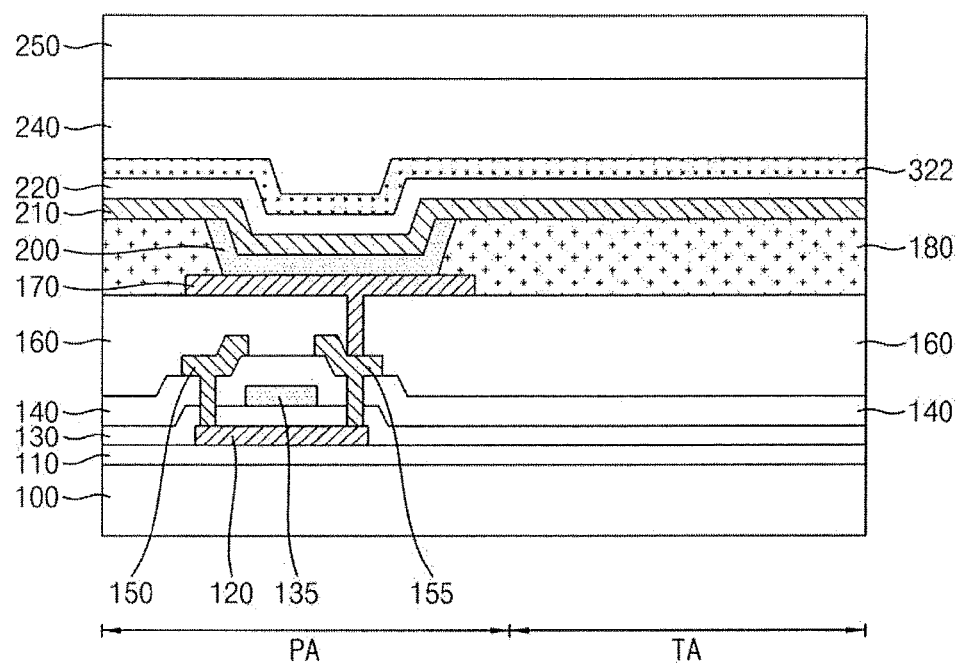
FIG. 23 illustrates a cross-sectional diagram of further still another example of a transparent display device.

FIG. 23 is a cross-sectional diagram illustrating further still another example of a transparent display device. The transparent display device of the present example embodiments is substantially the same as or similar to the transparent display device explained with reference to FIG. 22 except for disposition of an anti-diffraction layer 322. Thus, the same reference numerals will be used to refer to the same or like parts as those described in the example embodiments of FIGS. 1 to 12, and any repetitive explanation concerning the above elements will be omitted.

The capping layer 220 and the anti-diffraction layer 322 may be sequentially and continuously stacked along a surface of the second electrode 210. In some embodiments, the anti-diffraction layer 322 may include a plurality of nano wires randomly arranged in a network structure.

According to the transparent display device of the present example embodiments, the anti-diffraction layer 322 on the capping layer 220 may reduce or prevent light that passes through boundaries between the transmission area TA and the pixel area PA from diffracting. Thus, the anti-diffraction layer 320 may reduce diffraction images that are displayed.

Figure 24:
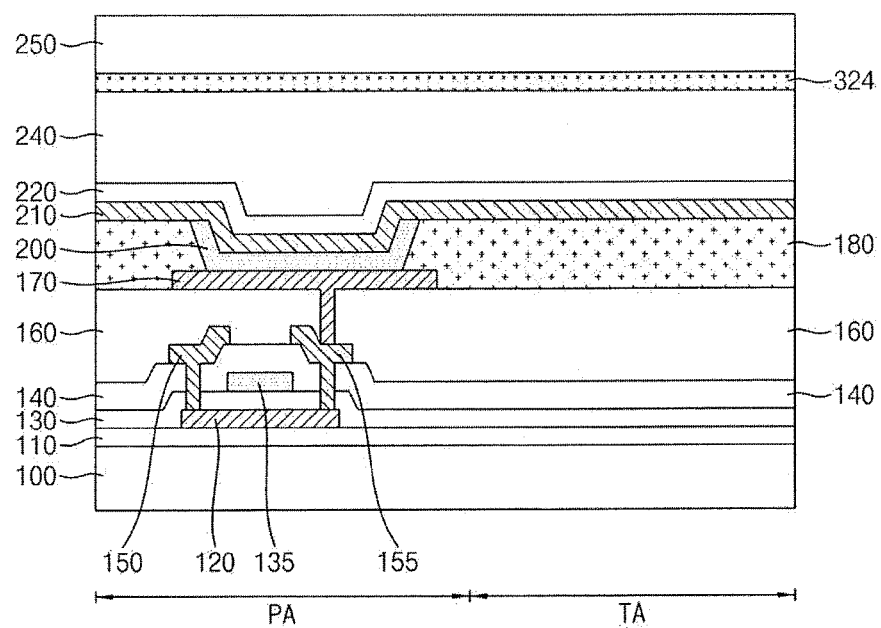
FIG. 24 illustrates a cross-sectional diagram of further still another example of a transparent display device.

FIG. 24 is a cross-sectional diagram illustrating further still another example of a transparent display device. The transparent display device of the present example embodiments is substantially the same as or similar to the transparent display device explained with reference to FIG. 23 except for disposition of an anti-diffraction layer 324. Thus, the same reference numerals will be used to refer to the same or like parts as those described in the example embodiments of FIGS. 1 to 12, and any repetitive explanation concerning the above elements will be omitted.

The encapsulation substrate 250 may be disposed on the capping layer 240. The packed layer 240 may be between the capping layer 220 and the encapsulation substrate 250. The anti-diffraction layer 324 may be disposed under a lower surface of the encapsulation substrate 250. The anti-diffraction layer 324 may be between the encapsulation substrate 250 and the capping layer 220. In some embodiments, the anti-diffraction layer 324 may include a plurality of nano wires randomly arranged in a network structure.

According to the transparent display device of the present example embodiments, the anti-diffraction layer 324 under the encapsulation substrate 250 may reduce or prevent light that pass boundaries between the transmission area TA and the pixel area PA from diffracting. Thus, the anti-diffraction layer 324 may reduce diffraction images that are displayed.

Figure 25:
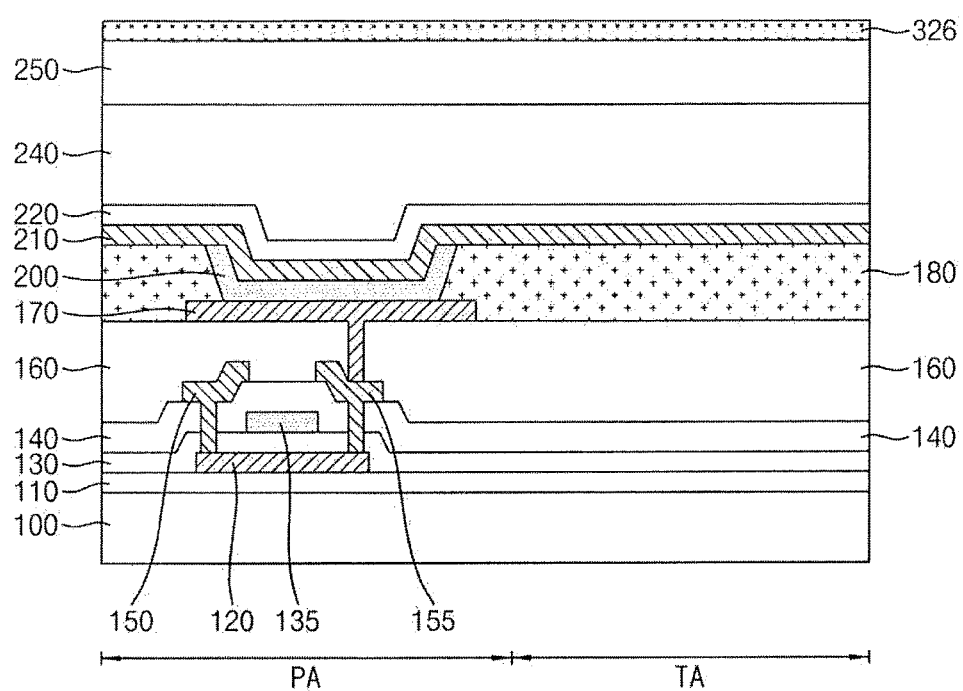
FIG. 25 illustrates a cross-sectional diagram of further still another example of a transparent display device.

FIG. 25 is a cross-sectional diagram illustrating further still another example of a transparent display device. The transparent display device of the present example embodiments is substantially the same as or similar to the transparent display device explained with reference to FIG. 24 except for disposition of an anti-diffraction layer 326. Thus, the same reference numerals will be used to refer to the same or like parts as those described in the example embodiments of FIGS. 1 to 12, and any repetitive explanation concerning the above elements will be omitted.

The encapsulation substrate 250 may be disposed on the capping layer 240. The packed layer 240 may be between the capping layer 220 and the encapsulation substrate 250. The anti-diffraction layer 326 may be disposed on an upper surface of the encapsulation substrate 250. The anti-diffraction layer 326 may overlap the pixel area PA and the transmission area TA. In some embodiments, the anti-diffraction layer 326 may include a plurality of nano wires randomly arranged in a network structure.

According to the transparent display device of the present example embodiments, the anti-diffraction layer 326 on the encapsulation substrate 250 may reduce or prevent light that pass boundaries between the transmission area TA and the pixel area PA from diffracting. Thus, the anti-diffraction layer 326 may reduce diffraction images that are displayed.

The present embodiments may be applied to any display device and any system including the transparent display device. For example, the present embodiments may be applied to a television, a computer monitor, a laptop, a digital camera, a cellular phone, a smart phone, a smart pad, a personal digital assistant (PDA), a portable multimedia player (PMP), a MP3 player, a navigation system, a game console, a video phone, a head up display, etc.

Therefore, the transparent display device according to example embodiments may include the anti-diffraction layer to reduce or prevent light that pass boundaries between the transmission area and the pixel area from diffracting. In addition, the anti-diffraction layer may be disposed on various layers. Thus, the anti-diffraction layer may reduce diffraction images that are displayed. Accordingly, definition of an image of the transparent display device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A transparent display device, comprising:
    a substrate having a pixel area and a transmission area;
    a pixel circuit on the pixel area of the substrate;
    an insulation structure on the substrate to cover the pixel circuit;
    a first electrode on the pixel area of the substrate, the first electrode at least partially penetrating the insulation structure and electrically connected to the pixel circuit;
    a display layer on the first electrode;
    a second electrode facing the first electrode and covering the display layer; and
    an anti-diffraction layer on the substrate, the anti-diffraction layer at least partially overlapping the transmission area and including a plurality of nano wires.

2. The device as claimed in claim 1, wherein the nano wires are randomly arranged in a network structure.

3. The device as claimed in claim 2, wherein the nano wires includes a metal.

4. The device as claimed in claim 2, wherein a maximum spacing between adjacent nano wires is within a range of about 100 nm to about 500 nm.

5. The device as claimed in claim 1, wherein a first portion of the anti-diffraction layer is in the same layer as the first electrode.

6. The device as claimed in claim 5, wherein a second portion of the anti-diffraction layer covers the first electrode.

7. The device as claimed in claim 1, further including:
    a pixel defining layer on the insulation structure, the pixel defining layer exposing the first electrode,
    wherein a first portion of the anti-diffraction layer is disposed on the pixel defining layer.

8. The device as claimed in claim 7, wherein a second portion of the anti-diffraction layer overlaps the pixel area, and is disposed below the display layer.

9. The device as claimed in claim 7, wherein a second portion of the anti-diffraction layer overlaps the pixel area, and wherein the second portion of the anti-diffraction layer is on the display layer.

10. The device as claimed in claim 1, wherein the second electrode overlaps the pixel area and the transmission area, a portion of the anti-diffraction layer is disposed on the second electrode.

11. The device as claimed in claim 10, further including:
a pixel defining layer that defines a transmitting window exposing the insulation structure of the transmission area,
wherein the second electrode and the anti-diffraction layer are sequentially stacked on the transmission area along a surface of the transmitting window.

12. The device as claimed in claim 1, wherein:
the pixel circuit includes
an active pattern,
a gate electrode,
a source electrode, and
a drain electrode,
the insulation structure includes:
a gate insulation layer on the substrate to cover the active pattern;
an insulating interlayer on the gate insulation layer to cover the gate electrode; and
a via insulation layer on the insulating interlayer to cover the source electrode and the drain electrode,
the source electrode and the drain electrode penetrate the insulation interlayer and the gate insulation layer, and contact the active pattern, and
the first electrode is on the via insulation layer, penetrates the via insulation layer, and contacts the drain electrode.

13. The device as claimed in claim 12, wherein:
the via insulation layer is individually disposed on the pixel area,
a transmitting window is defined on the transmission area by sidewalls of the via insulation layer and a upper surface of the insulating interlayer, and
the second electrode and the anti-diffraction layer are sequentially stacked on the transmission area along a surface of the transmitting window.

14. The device as claimed in claim 12, wherein:
the via insulation layer and the insulating interlayer are on the pixel area,
a transmitting window is defined on the transmission area by sidewalls of the via insulation layer and a upper surface of the gate insulation layer, and
the second electrode and the anti-diffraction layer are sequentially stacked on the transmission area along a surface of the transmitting window.

15. The device as claimed in claim 1, further including:
a capping layer continuously disposed on the pixel area and the transmission area of the second electrode,
wherein a portion of the anti-diffraction layer is on the capping layer.

16. The device as claimed in claim 15, wherein the anti-diffraction layer is along a upper surface of the capping layer.

17. The device as claimed in claim 15, further including a packed layer and an encapsulation substrate that are sequentially stacked on the capping layer.

18. The device as claimed in claim 17, wherein the portion of the anti-diffraction layer is interposed between the packed layer and the encapsulation substrate.

19. The device as claimed in claim 17, wherein the portion of the anti-diffraction layer is on the encapsulation substrate.

20. The device as claimed in claim 19, wherein the anti-diffraction layer is along an upper surface of the encapsulation substrate.

* * * * *